(12) United States Patent  
Kubota

(10) Patent No.: US 9,345,175 B2  
(45) Date of Patent: May 17, 2016

(54) ELECTRONIC APPARATUS AND COOLING METHOD

(71) Applicant: FUJITSU LIMITED, Kawasaki-shi, Kanagawa (JP)

(72) Inventor: Jumpei Kubota, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 273 days.

(21) Appl. No.: 14/134,509

(22) Filed: Dec. 19, 2013

(65) Prior Publication Data

US 2014/0260328 A1    Sep. 18, 2014

(30) Foreign Application Priority Data

Mar. 18, 2013  (JP) ................. 2013-054824

(51) Int. Cl.
- *F25B 21/02* (2006.01)
- *H05K 7/20* (2006.01)
- *H01L 23/34* (2006.01)
- *H01L 23/38* (2006.01)

(52) U.S. Cl.  
CPC ............ *H05K 7/20809* (2013.01); *H01L 23/34* (2013.01); *H01L 23/38* (2013.01); *H01L 2924/0002* (2013.01); *Y10T 29/49377* (2015.01)

(58) Field of Classification Search  
CPC ........ F25B 21/02; H01L 35/30; H01L 23/427  
USPC ..................... 62/3.2, 3.3, 3.4, 259.2  
See application file for complete search history.

(56) References Cited

U.S. PATENT DOCUMENTS

| | | | | |
|---|---|---|---|---|
| 4,248,259 A * | 2/1981 | Kaartinen | ............ | F16K 49/002 137/334 |
| 4,490,982 A * | 1/1985 | Christmas | ................ | A01N 1/00 62/3.2 |
| 6,634,177 B2 * | 10/2003 | Lin | ......................... | F25B 21/02 62/161 |

FOREIGN PATENT DOCUMENTS

| JP | 2003-176942 | 6/2003 |
|---|---|---|
| JP | 2004-239789 | 8/2004 |
| JP | 2006-32515 | 2/2006 |
| JP | 2012-18998 | 1/2012 |

* cited by examiner

*Primary Examiner* — Melvin Jones  
(74) *Attorney, Agent, or Firm* — Staas & Halsey LLP

(57) ABSTRACT

A system that cools an electric component by a cooling medium cooled by a heat exchanger, the system includes a pipe through which a cooling medium to cool the electronic component flows; a metal member configured to be coupled with an outer surface of the pipe; a Peltier device configured to cool the metal member to a temperature lower than a temperature of the outer surface of the pipe; a detector that detects dew condensation of outer air occurring on the metal member; and a processor that lowers the temperature of the cooling medium, and stops lowering a temperature of cooling medium when the occurrence of dew condensation of outer air on the metal member is detected.

20 Claims, 7 Drawing Sheets

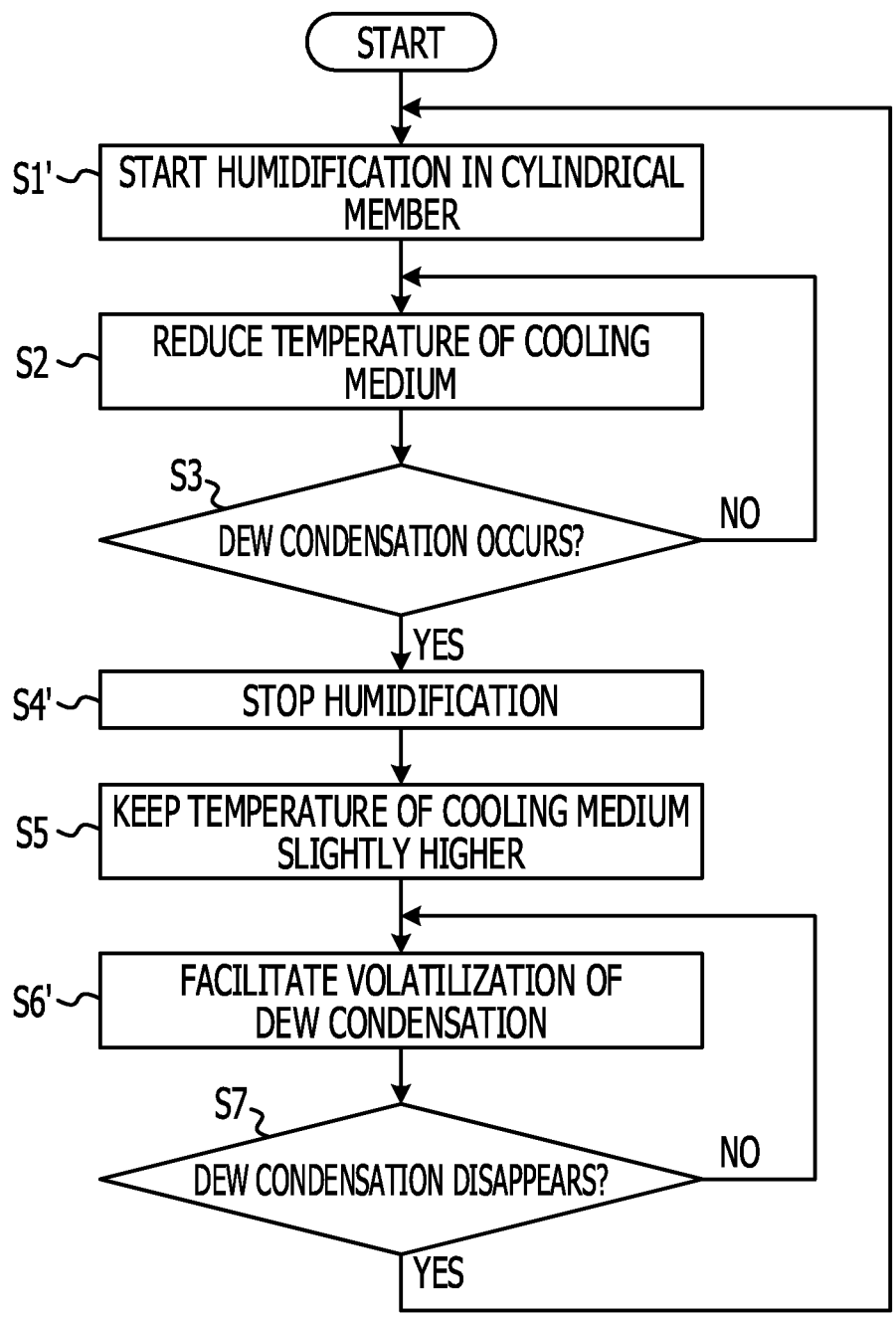

ELECTRONIC APPARATUS AND COOLING METHOD

CROSS-REFERENCE TO RELATED APPLICATION

This application is based upon and claims the benefit of priority of the prior Japanese Patent Application No. 2013-054824, filed on Mar. 18, 2013, the entire contents of which are incorporated herein by reference.

FIELD

The embodiment discussed herein is related to an electronic apparatus and a cooling method.

BACKGROUND

It is desirable to keep the temperature of a cooling medium used to cool an electronic component as low as possible. However, if the temperature of the cooling medium is too low, dew condensation of outer air occurs in the vicinity of a pipe through which the cooling medium flows. An electronic component on which this type of dew condensation occurred could lead to a failure. Examples of the related art concerning techniques for suppressing dew condensation are Japanese Laid-open Patent Publication No. 2012-18998, Japanese Laid-open Patent Publication No. 2006-32515, Japanese Laid-open Patent Publication No. 2003-176942, Japanese Laid-open Patent Publication No. 2004-239789, and so on.

The temperature and humidity of air in the vicinity of the pipe are detected to calculate the dew point and the temperature of the cooling medium is controlled to exceed the calculated dew point, so that dew condensation does not occur on the pipe. The detection results by a temperature sensor for detecting the temperature of air and a humidity sensor for detecting the humidity include error. The dew point may be calculated on the basis of the detected temperature and detected humidity that include error. Accordingly, the calculated dew point may indicate variations. The temperature of the cooling medium is set to a value larger than the calculated dew point in consideration of such variations. It is difficult to lower the temperature of the cooling medium as low as possible in the range in which no dew condensation occurs, and the cooling capability of the cooling medium is not fully utilized in this range.

SUMMARY

According to an aspect of an embodiment, a system that cools an electric component by a cooling medium cooled by a heat exchanger, the system includes a pipe through which a cooling medium to cool the electronic component flows; a metal member configured to be coupled with an outer surface of the pipe; a Peltier device configured to cool the metal member to a temperature lower than a temperature of the outer surface of the pipe; a detector that detects dew condensation of outer air occurring on the metal member; and a processor that lowers the temperature of the cooling medium, and stops lowering a temperature of cooling medium when the occurrence of dew condensation of outer air on the metal member is detected.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a flowchart depicting an example of control performed by a controller.

DESCRIPTION OF EMBODIMENT

Figure 1:
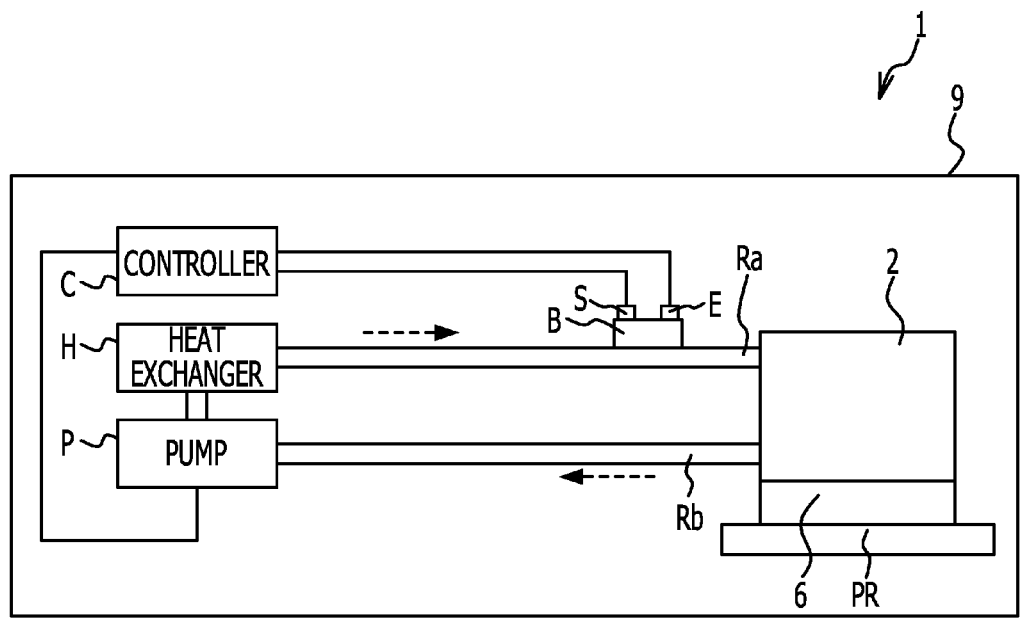
FIG. 1 depicts an example of an electronic apparatus.

FIG. 1 depicts an example of an electronic apparatus. An electronic apparatus 1 depicted in FIG. 1 is an information processing apparatus such as, for example, a super computer, server, network apparatus, desktop computer, or notebook computer. The electronic apparatus 1 includes an electronic component 6, which will be described in detail later, and a cabinet 9 that houses the electronic component 6.

The electronic apparatus 1 includes a heat reception plate 2, a pump P, a heat exchanger H, an electronic component 6, a printed circuit board PR, and a controller C. The pump P, the heat exchanger H, and the heat reception plate 2 are coupled with pipes, and a cooling medium circulates through these components. The heat exchanger H and the heat reception plate 2 are coupled with a pipe Ra. The heat reception plate 2 and the pump P are coupled with a pipe Rb. The cooling medium discharged from the pump P circulates through the heat exchanger H, the pipe Ra, the heat reception plate 2, and the pipe Rb in sequence.

The heat reception plate 2 is disposed in contact with the electronic component 6 and the cooling medium flows through the heat reception plate 2. The heat reception plate 2 receives heat from the electronic component 6 and transfers it to the cooling medium. The heat reception plate 2 is an example of a heat receiving section. The heat exchanger H cools the cooling medium by dissipating heat externally. The cooling medium cooled by the heat exchanger H flows through the pipe Ra toward the heat reception plate 2. The heat exchanger H may be of air-cooling or water-cooling type. When the heat exchanger H is of air-cooling type, a fan for cooling the heat exchanger H may be disposed. As the cooling medium, for example, propylene glycol series antifreeze liquid is used, but the cooling medium is not limited to this.

The electronic component 6 is an electronic component such as, for example, a large scale integrated circuit (LSI) or central processing unit (CPU). The electronic component 6 may be a single package incorporating a plurality of electronic components or a single semiconductor chip or so on. The electronic component 6 generates heat when receiving electric power. The electronic component 6 is mounted on the printed circuit board PR. A plate B is coupled to the pipe Ra. A condensation sensor S and a Peltier device E are disposed on the plate B so as to be in contact with the plate B. The condensation sensor S and the Peltier device E are electrically coupled to the controller C.

The controller C includes a CPU, a read only memory (ROM), a random access memory (RAM), and so on, and controls the temperature of the cooling medium. When, for example, the heat exchanger H is of water-cooling type, the controller C changes the temperature of the cooling medium that receives heat from the electronic component 6 by controlling the flow amount and flow rate of the cooling medium that receives heat from the electronic component 6 and those of the cooling medium of the partner of heat exchange. In this case, the larger the flow amount or flow rate of the cooling medium of the partner of heat exchange, the lower the temperature of the cooling medium that receives heat from the electronic component 6. In this case, the controller C controls the pump to control the flow amount of the cooling medium of the partner of heat exchange. When the heat exchanger H is of water-cooling type, the controller C controls the temperature of the cooling medium that receives heat from the electronic component 6 by reducing the amount of the cooling medium that receives heat from the electronic component 6 when it flows through the heat exchanger H. In this case, the controller C controls the pump P. When the heat exchanger H is of air-cooling type, the controller C controls the temperature of the cooling medium that receives heat from the electronic component 6 by, for example, increasing the rotation speed of a fan for blowing air into the heat exchanger H.

Figure 2:
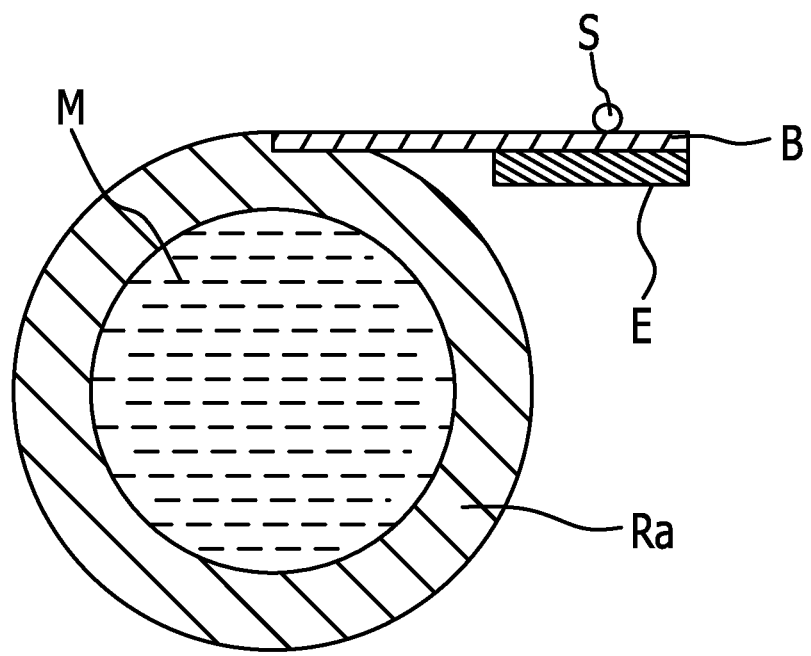
FIG. 2 depicts an example of the structure of a pipe and its peripherals.

FIG. 2 depicts an example of the structure of a pipe and its peripherals. As described above, a cooling medium M cooled by the heat exchanger H flows through the pipe Ra. The plate B is a thin plate, for example. The plate B is coupled to the pipe Ra. The connection may be made through welding, an adhesive, or engagement of the plate B with a hole formed in the pipe Ra. The plate B is made of a material with a high thermal conductivity. The plate B is a metal member made of metal such as, for example, cupper or aluminum. Similarly, the pipe Ra is a metal member made of metal. Heat of the cooling medium M is transferred to the plate B through the pipe Ra. Generally, the temperature of the cooling medium M after being cooled by the heat exchanger H is lower than that of air in the cabinet 9. Accordingly, the temperatures of the pipe Ra and the plate B are lower than that of air in the cabinet 9. The plate B is an example of a thermal conductor.

A condensation sensor S is disposed on the plate B. The condensation sensor S determines whether dew condensation of outer air occurs on an upper surface of the plate B. The condensation sensor S is an example of a detector. The controller C determines whether dew condensation occurs on the plate B based on changes in an output from the condensation sensor S. The Peltier device E is secured to a lower surface of the plate B. The Peltier device E cools plate B when supplied with electric power. The Peltier device E cools the plate B so that the temperature of the plate B is lower than that of an outer surface of the pipe Ra. Accordingly, the temperature of the plate B is lower than that of the outer surface of the pipe Ra while the Peltier device E cools the plate B. That is, dew condensation is easy to occur on the plate B earlier than on the pipe Ra. The Peltier device E is an example of a facilitating unit that facilitates occurrence of dew condensation on the plate B.

The temperature of the cooling medium flowing through the pipe Ra is lower than that of the cooling medium flowing through the pipe Rb. Accordingly, dew condensation is easy to occur on the pipe Ra earlier than on the pipe Rb. The plate B is coupled to the pipe Ra. The plate B is preferably disposed in a position away from the electronic component 6 and the printed circuit board PR, so that dew condensation generated on the plate B is not attached to the electronic component 6 and so on, which will be described in detail later.

Figure 3:
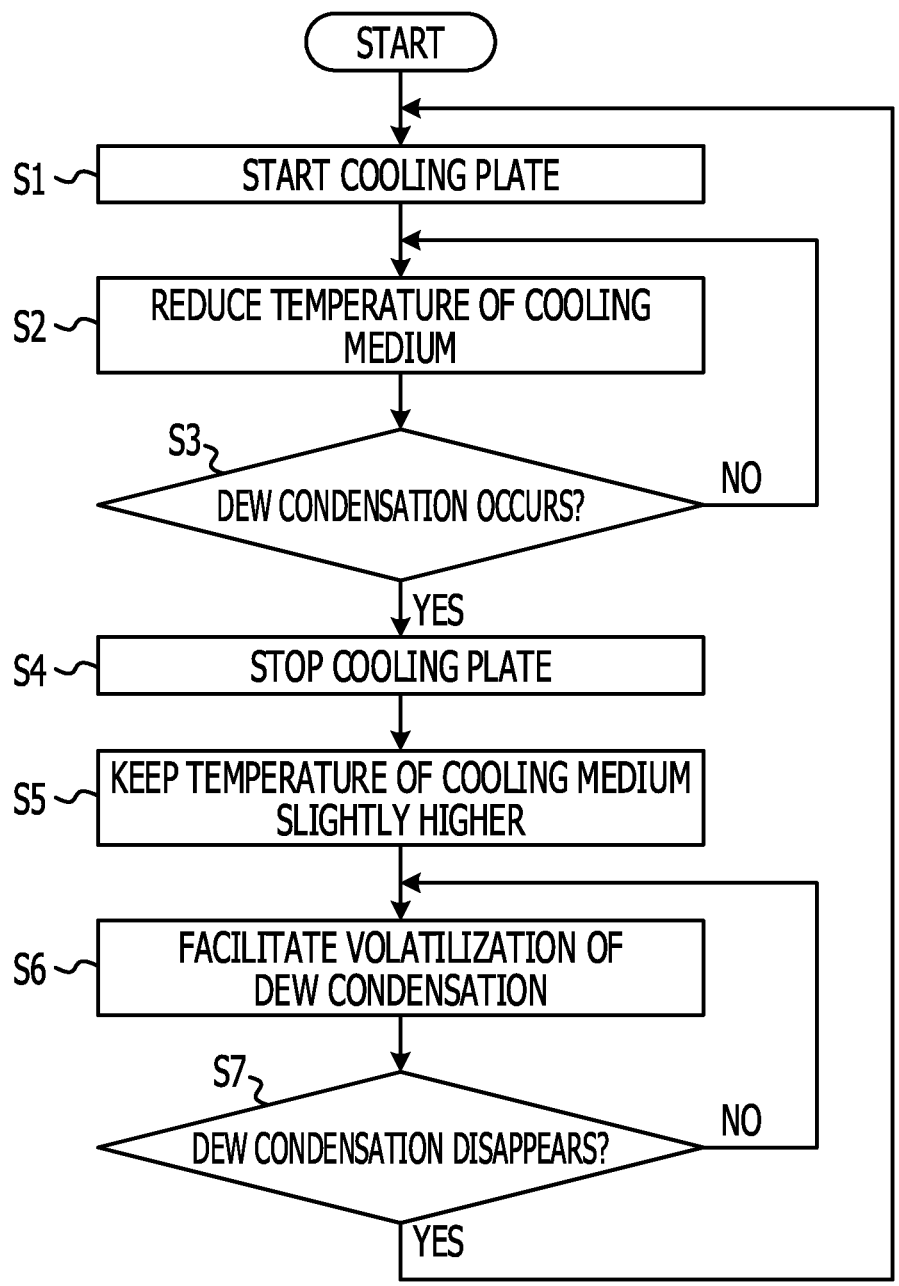
FIG. 3 is a flowchart depicting an example of control performed by a controller.

FIG. 3 is a flowchart depicting an example of control performed by the controller C. The controller C supplies electric power to the Peltier device E to start cooling the plate B (S1). That is, the controller C performs processing for facilitating occurrence of dew condensation on the plate B. Next, the controller C reduces the temperature of the cooling medium M using the above method (S2). Here, the controller C gradually reduces the temperature of the cooling medium M. When the heat exchanger H is of water-cooling type, the controller C gradually increases the flow amount of the cooling medium of the partner of heat exchange or gradually reduces the flow amount of the cooling medium M flowing through the heat exchanger H. When the heat exchanger H is of air-cooling type, the controller C gradually increases the number of revolutions of a fan for cooling the heat exchanger H.

Next, the controller C determines whether dew condensation occurs on the plate B based on an output from the condensation sensor S (S3). If the controller C determines that no dew condensation occurs, the controller C continues processing of S2 and further reduces the temperature of the cooling medium M. This causes the temperature of the cooling medium M to be reduced until dew condensation occurs on the plate B.

If the controller C determines that dew condensation has occurred, the controller C stops supplying electric power to the Peltier device E to stop cooling the plate B (S4) and keeps the temperature of the cooling medium M slightly higher than that of the cooling medium M observed when dew condensation occurs on the plate B (S5). For example, when the heat exchanger H is of water-cooling type, the controller C keeps the flow amount of the cooling medium M of the partner of heat exchange slightly lower than that observed when dew condensation occurs or the controller C keeps the flow amount of the cooling medium M flowing through the heat exchanger H slightly higher than that observed when dew condensation occurs. By stopping reduction in the temperature of the cooling medium M when dew condensation occurs on the plate B as described above, the cooling medium M is kept as low as possible in the temperature range in which no dew condensation occurs on the pipe Ra, making the most of the cooling capacity of the cooling medium M.

Next, the controller C facilitates the volatilization of dew condensation that occurred on the plate B (S6). More specifically, the controller C feeds current in a direction opposite to that for cooling the plate B to heat the plate B, facilitating volatilization of dew condensation that occurred on the plate B. Next, the controller C determines whether dew condensation on the plate B has disappeared based on an output from the condensation sensor S (S7). If dew condensation has not disappeared, the controller C continues the processing of S6 to cause dew condensation to disappear. If dew condensation has disappeared, the controller C performs the processing of S1 again. As described above, dew condensation that has occurred on the plate B is volatilized and the processing of S1 and later is repeated. This reduces the temperature of the cooling medium M as much as possible in the range in which no dew condensation occurs on the pipe Ra in response to variations in heat amounts the cooling medium M receives from the electronic component 6 and variations in the temperature and humidity of air surrounding the pipe Ra.

In S5 above, when the temperature of the cooling medium is kept slightly higher after occurrence of dew condensation, but the temperature of the plate B is much lower than that of the pipe Ra on occurrence of dew condensation on the plate B, the temperature of the cooling medium M on occurrence of dew condensation may be kept without performing the processing of S5 above. This is because no dew condensation occurs on the pipe Ra.

In S6 above, the plate B may be heated by a heating unit other than the Peltier device. For example, the plate B may be heated by a heater. Alternatively, hot air generated by a heater and fan may be transferred to the plate B.

Execution of S2 after execution of S1 to S7 is not desired. For example, by executing S1 after executing S1 to S7, the controller C may raise the temperature of the cooling medium M when dew condensation occurs on the plate B due to variations in heat amounts the cooling medium M receives from the electronic component 6 and variations in air surrounding the pipe Ra. This avoids occurrence of dew condensation on the pipe Ra.

A condensation sensor other than the condensation sensor S may be disposed on the pipe Ra closer to the electronic component 6 than the plate B. For example, if this condensation sensor detects dew condensation, the controller C may stop the pump P and raise the temperature of the cooling medium M to avoid occurrence of further dew condensation.

In the above embodiment, the controller C is coupled electrically to the condensation sensor S and the Peltier device E as well as controlling the pump P, but this structure is not restrictive. For example, a controller that controls a pump and another controller that is coupled electrically to the condensation sensor S and the Peltier device E may be disposed separately, and both controllers may communicate with each other.

Figure 4:
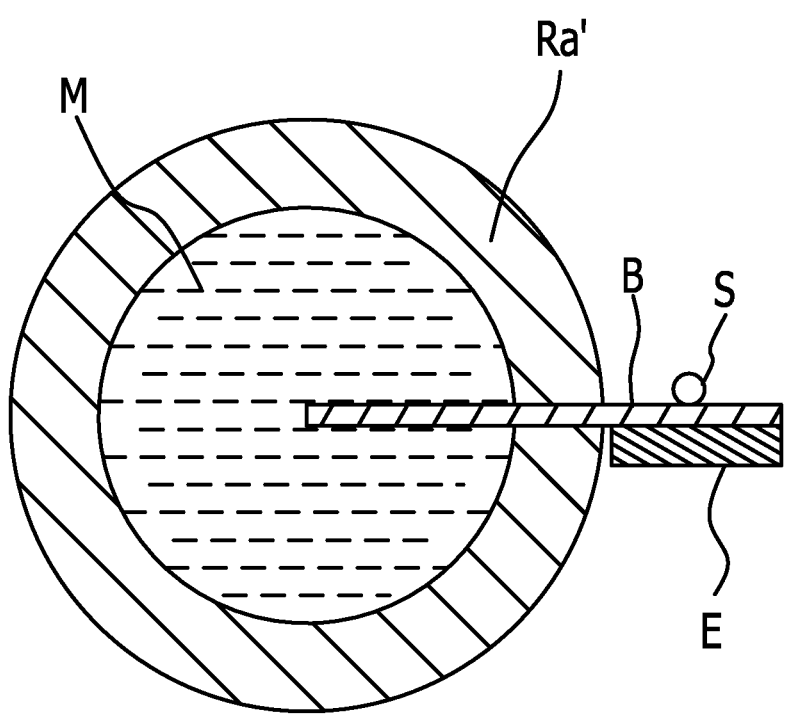
FIG. 4 depicts a modification of the structure of the pipe and its peripherals.

FIG. 4 depicts a modification of the structure of the pipe and its peripherals. A pipe Ra' is made of a material with a low thermal conductivity. The pipe Ra' is a tube or hose that is made of plastic or rubber, for example. The plate B penetrates through an outer wall of the pipe Ra' and is exposed directly to the cooling medium M. Accordingly, even when the thermal conductivity of the pipe Ra' is low, the heat of the cooling medium M is transferred to the plate B earlier than to the pipe Ra', so that dew condensation is easy to occur on the plate B earlier than on the pipe Ra'.

Figure 5:
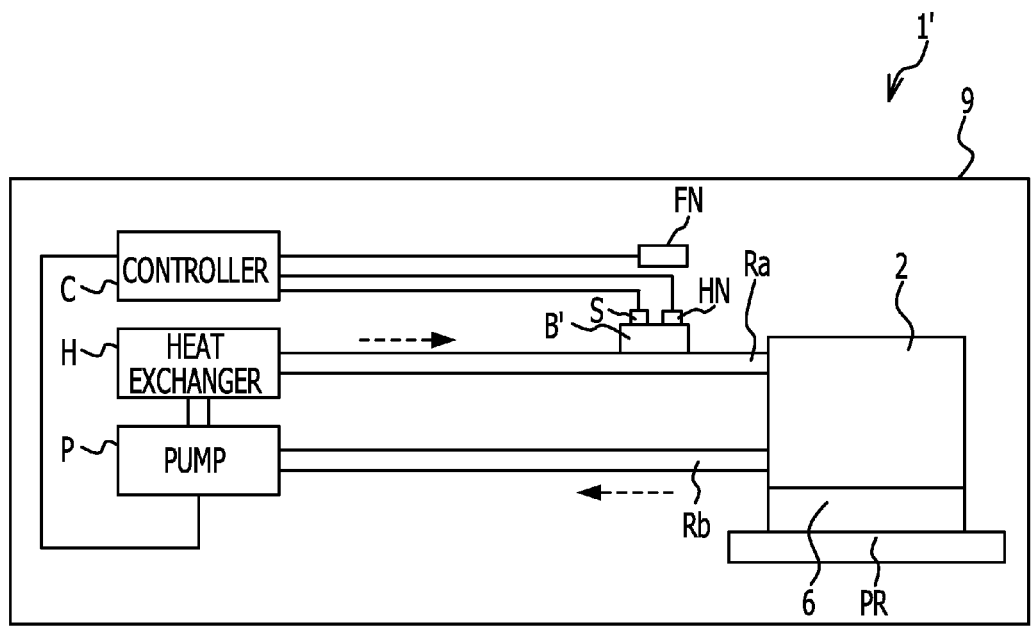
FIG. 5 depicts a modification of the electronic apparatus.

FIG. 5 depicts a modification of the electronic apparatus. In an electronic apparatus 1', reference characters that are similar to or the same as those of the electronic apparatus 1 are used to omit their description. A fan FN, which is electrically coupled to a controller C', is disposed.

Figure 6:
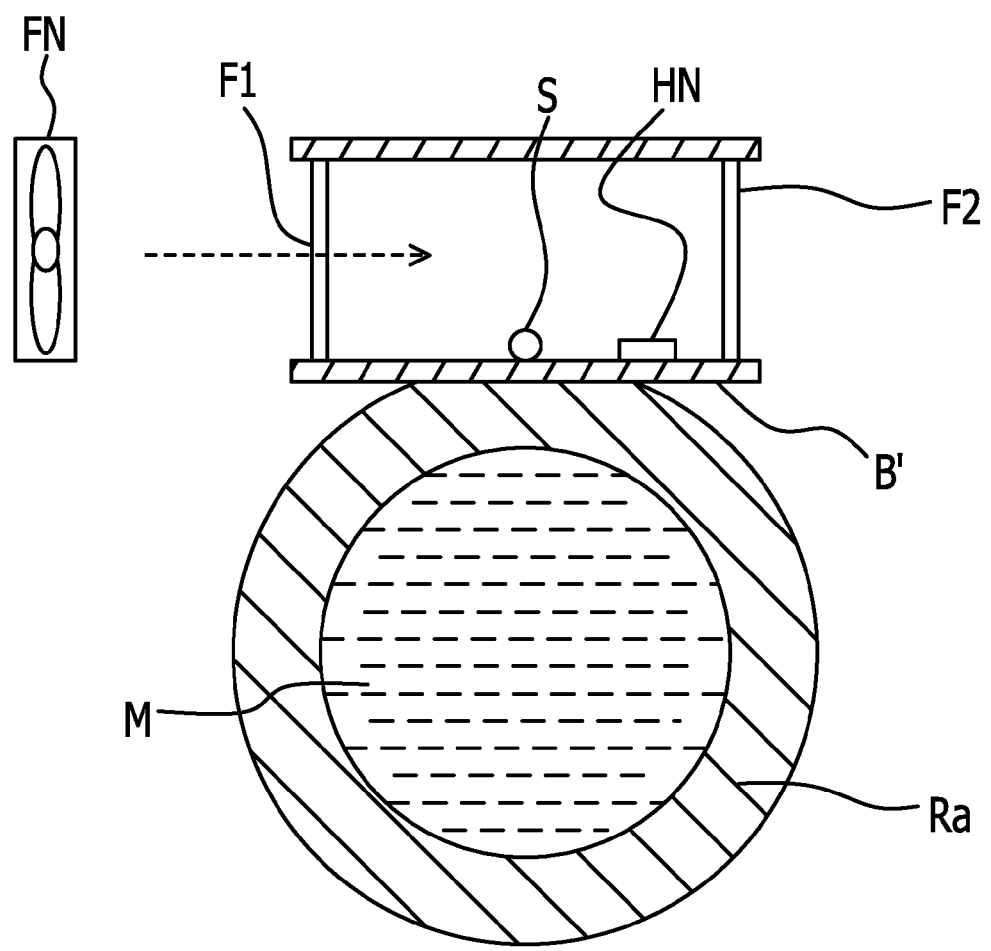
FIG. 6 depicts the structure of the pipe and its peripherals in the modification of the electronic apparatus.

FIG. 6 depicts the structure of the pipe and its peripherals in the modification of the electronic apparatus. A cylindrical member B' is secured to the outer surface of the pipe Ra. The cylindrical member B' is made of a material with a high thermal conductivity. The cylindrical member B' is made of metal such as, for example, cupper or aluminum. The cylindrical member B' is an example of a thermal conductor. A humidification filter F1 is disposed on an opening at one end of the cylindrical member B'. A dehumidification filter F2 is disposed on an opening at another end of the cylindrical member B'. The condensation sensor S is placed in the cylindrical member B'. A hole through which a cable for electrically connecting the condensation sensor S and the controller C passes is disposed in cylindrical member B'.

The fan FN blasts air so that it flows through the cylindrical member B' via the humidification filter F1 and is exhausted from the dehumidification filter F2. The humidification filter F1 allows air and moisture in air to path through it. On the other hand, the dehumidification filter F2 allows air to path through it, but does not allow moisture in air to pass through it. Accordingly, the temperature in the cylindrical member B' becomes higher than that around the pipe Ra. The temperature of the atmosphere around the pipe Ra is considered to be substantially the same as the temperature of the atmosphere in the cylindrical member B'. Therefore, dew condensation occurs in the cylindrical member B' easier than around the pipe Ra. This causes dew condensation to occur in the cylindrical member B' earlier than around the pipe Ra. The humidifier filter F1, the dehumidifier filter F2, and an example of the facilitating unit are depicted.

A heating element HN for heating the cylindrical member B' is disposed in the cylindrical member B'. The heating element HN is controlled by the controller C'. The heating element HN may be secured to an outer surface of the cylindrical member B'. The heating element HN is a part of the heating unit. The cylindrical member B' is cylindrical, but this shape is not restrictive. For example, a cylindrical member that includes a planar thermal conductor to which another member is secured and entirely surrounds the condensation sensor S may be formed. If natural wind flows through the cabinet 9, the fan FN is not used.

FIG. 7 is a flowchart depicting an example of control performed by the controller C'. The controller C' starts humidification in the cylindrical member B' by driving the fan FN (S1'). If dew condensation occurs in the cylindrical member B' (Yes in S3), the controller C' stops the fan FN to stop humidification (S4'). Then, the controller C' heats the cylindrical member B' by using the heating element HN to facilitate volatilization of dew condensation (S6'). This keeps the temperature of the cooling medium M as low as possible in the range in which no dew condensation occurs on the pipe Ra, making the most of the cooling capacity of the cooling medium M. Also in this case, execution of S2 after execution of S7 is not desired. In S6', the air in the cylindrical member B' may be exhausted externally via the heating element HN by heating the cylindrical member B' with the heating element HN and reversing the fan FN. The Peltier device may be used instead of the heating element HN to cylindrical member B'.

The preferred embodiment of the present disclosure has been described in detail above, but the disclosure is not limited to the particular embodiment, and various modifications and changes may be performed without departing from the spirit and scope of the disclosure described in claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A system that cools an electric component by a cooling medium cooled by a heat exchanger, the system comprising:
   a pipe through which the cooling medium to cool the electronic component flows;
   a metal member configured to be coupled with an outer surface of the pipe;
   a Peltier device configured to cool the metal member to a temperature lower than a temperature of the outer surface of the pipe;
   a detector that detects dew condensation of outer air occurring on the metal member; and
   a processor that lowers a temperature of the cooling medium, and stops lowering the temperature of cooling medium when an occurrence of dew condensation of outer air on the metal member is detected, wherein the pipe is disposed between the heat exchanger to dissipate heat of the cooling medium and a heat receiver to transfer heat from a heating member to the cooling medium.

2. The system according to claim 1, wherein the processor controls a pump that controls a flow amount of the cooling medium when the occurrence of dew condensation of outer air on the metal member is detected.

3. The system according to claim 1, wherein the processor controls a fan that cools the heat exchanger when the occurrence of dew condensation of outer air on the metal member is detected.

4. The system according to claim 1, wherein the Peltier device generates the condensation on the metal member by humidifying the metal member.

5. The system according to claim 4, wherein the metal member is a cylindrical member that surrounds the detector and the Peltier device includes a humidification filter and a dehumidification filter incorporated in the cylindrical member.

6. The system according to claim 5, wherein the humidification filter is provided on an opening at one end of the cylindrical member and the dehumidification filter is provided on an opening at another end of the cylindrical member.

7. The system according to claim 6, wherein the cylindrical member has a hole through which a cable electrically connects the detector and the processor passes.

8. The system according to claim 1, wherein the Peltier device heats the metal member when the detector detects dew condensation.

9. The system according to claim 1, wherein, when the detector detects condensation, a power supplied to the Peltier device is switched so that the Peltier device heats the metal member.

10. The system according to claim 4, wherein the processor raises the temperature of the cooling medium when the occurrence of dew condensation on the metal member is detected.

11. The system according to claim 1, wherein the processor regulates the temperature based on change in an output of the detector.

12. The cooling method according to claim 11, wherein the temperature of the cooling medium is maintained at a lowest value within a temperature range in which no dew condensation occurs on the pipe.

13. A cooling method of a system that cools an electric component by a cooling medium cooled by a heat exchanger, the cooling method comprising:

cooling, using a Peltier device, a metal member to a temperature lower than a temperature of the outer surface of the pipe;

detecting dew condensation of outer air occurring on the metal member; and lowering a temperature of the cooling medium, and stopping lowering the temperature of cooling medium when an occurrence of dew condensation of outer air on the metal member is detected, wherein the pipe is disposed between the heat exchanger to dissipate heat of the cooling medium and a heat receiver to transfer heat from a heating member to the cooling medium.

14. The cooling method according to claim 13, wherein the lowering includes controlling a pump that controls a flow amount of the cooling medium when the occurrence of dew condensation of outer air on the metal member is detected.

15. The cooling method according to claim 13, wherein the lowering includes controlling a fan that cools the heat exchanger when the occurrence of dew condensation of outer air on the metal member is detected.

16. The cooling method according to claim 13, wherein the cooling includes generating, by the Peltier device, the condensation on the metal member by humidifying the metal member.

17. The cooling method according to claim 16, wherein the metal member is a cylindrical member that surrounds the detector and the Peltier device includes a humidification filter and a dehumidification filter incorporated in the cylindrical member.

18. The cooling method according to claim 17, wherein the humidification filter is provided on an opening at one end of the cylindrical member and the dehumidification filter is provided on an opening at another end of the cylindrical member.

19. A method for the manufacture of system that cools an electric component by a cooling medium cooled by a heat exchanger, the method comprising:

forming a metal member on a pipe through which the cooling medium to cool the electronic component flows;

forming a sensor to detect dew condensation of outer air occurring on the metal member; and forming a controller to lower a temperature of the cooling medium, and stop lowering the temperature of cooling medium when an occurrence of dew condensation of outer air on the metal member is detected, wherein the pipe is disposed between the heat exchanger to dissipate heat of the cooling medium and a heat receiver to transfer heat from a heating member to the cooling medium.

20. The method for the manufacture according to claim 19, wherein the metal member penetrates through an outer wall of the pipe and is exposed to the cooling medium.

* * * * *